(12) United States Patent
Malone et al.

(10) Patent No.: US 7,325,588 B2
(45) Date of Patent: Feb. 5, 2008

(54) HIGH SERVICEABILITY LIQUID COOLING LOOP USING FLEXIBLE BELLOWS

(75) Inventors: Christopher G. Malone, Loomis, CA (US); Glenn C. Simon, Auburn, CA (US); Stephan K. Barsun, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 600 days.

(21) Appl. No.: 10/837,459

(22) Filed: Apr. 29, 2004

(65) Prior Publication Data
US 2005/0241799 A1   Nov. 3, 2005

(51) Int. Cl.
F28F 7/00   (2006.01)

(52) U.S. Cl. .................. 165/80.2; 165/80.1; 165/80.4; 361/689; 361/702

(58) Field of Classification Search ............... 165/80.2, 165/80.3, 80.4, 80.5, 80.1; 361/688, 689, 361/702; 257/712
See application file for complete search history.

(56) References Cited

U.S. PATENT DOCUMENTS

| | | | |
|---|---|---|---|
| 3,481,393 A | 12/1969 | Chu | |
| 4,455,504 A | 6/1984 | Iversen | |
| 4,712,609 A | 12/1987 | Iversen | |
| 5,560,362 A | 10/1996 | Sliwa, Jr. et al. | |
| 6,152,213 A | 11/2000 | Suzuki | |
| 6,173,761 B1 | 1/2001 | Chandratilleke et al. | |
| 6,529,377 B1 | 3/2003 | Nelson et al. | |

Primary Examiner—Ljiljana Ciric (57) ABSTRACT

A liquid loop cooling apparatus includes tubing enclosing an interior bore or lumen within which a cooling fluid can circulate, a moveable cold plate rigidly coupled to the tubing, and at least one flexible bellows coupled to the tubing and flexibly enabling movement of the moveable cold plate.

20 Claims, 11 Drawing Sheets

HIGH SERVICEABILITY LIQUID COOLING LOOP USING FLEXIBLE BELLOWS

BACKGROUND OF THE INVENTION

Electronic systems and equipment such as computer systems, network interfaces, storage systems, and telecommunications equipment are commonly enclosed within a chassis, cabinet or housing for support, physical security, and efficient usage of space. Electronic equipment contained within the enclosure generates a significant amount of heat. Thermal damage may occur to the electronic equipment unless the heat is removed.

Compact electronic systems and devices, for example compact computer servers, often have very little space available for implementing a cooling solution. Conventional air-cooled heat sinks generally must be directly connected to the heat source. The footprint of the heat sink cannot be much larger than the heat source given the intrinsic heat spreading resistance of an aluminum or copper heat sink. Given the restriction on heat sink height dictated by the form factor and the practical limits on heat sink footprint, cooling capabilities are highly restricted.

SUMMARY

In accordance with a cooling device embodiment, a liquid loop cooling apparatus includes tubing enclosing an interior bore or lumen within which a cooling fluid can circulate, a moveable cold plate rigidly coupled to the tubing, and at least one flexible bellows coupled to the tubing and flexibly enabling movement of the moveable cold plate.

BRIEF DESCRIPTION OF THE DRAWINGS

Embodiments of the invention relating to both structure and method of operation, may best be understood by referring to the following description and accompanying drawings.

DETAILED DESCRIPTION

Future electronic system architectures, such as compact server architectures, may use a liquid loop cooling solution to accommodate increasing power and density levels of microprocessors and associated electronics. A liquid loop system may have a pump to drive cooling fluid through cold plates attached to processors and other high-power components, and drive the fluid along tubes completing a loop between a cold plate, a heat exchanger, and the pump. One or more heat-dissipating components can be connected to the liquid loop tubing to apply cooling directly to heat sources, facilitating system cooling. Heat is removed from the loop by forced-air convection at the heat exchanger.

A flexible bellows can be included in the liquid loop to enable and facilitate serviceability of associated heat-dissipating components and devices.

A cold plate is a heat-exchanger in a liquid cooling loop that transfers heat from a heat-dissipating component to liquid via conduction and convection. In many liquid loop systems, the cold plate is rigidly or semi-rigidly attached to the liquid cooling loop tubing, making addition, removal, and/or replacement of a heat-dissipating component difficult. In an illustrative system, a flexible bellows is installed in the tubing of a liquid cooling loop, enabling simple and easy addition, removal, or replacement of heat-dissipating devices or components and associated system components. The bellows enables flexibility in the tubing so that the cold plate can rotate up and out of the way, enabling access to the heat-dissipating component.

Figure 1A:
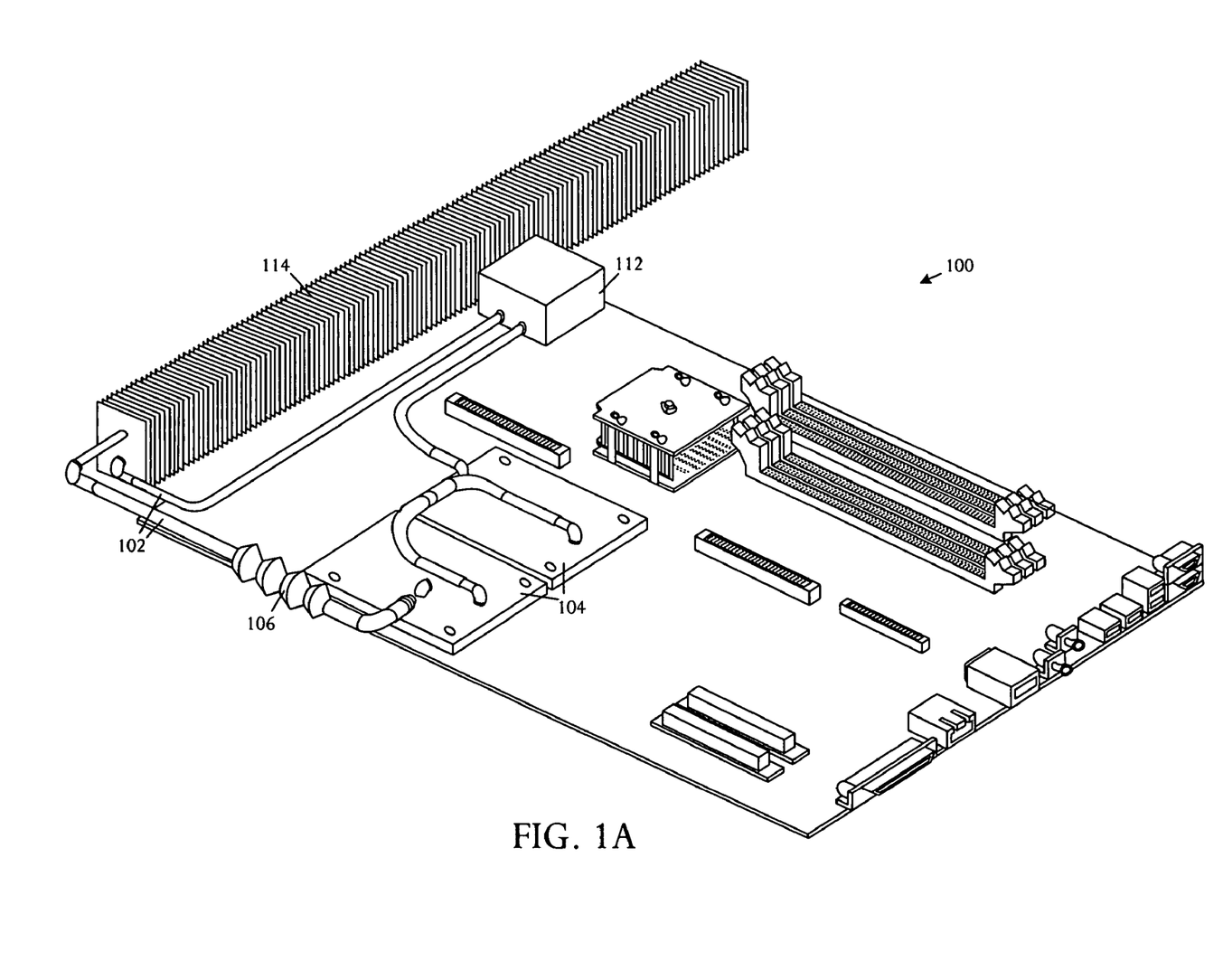
FIGS. 1A, 1B, 1C, and 1D are perspective pictorial diagrams illustrating various views and embodiments of liquid loop cooling systems that include a bellows to facilitate serviceability.
Figure 1B:
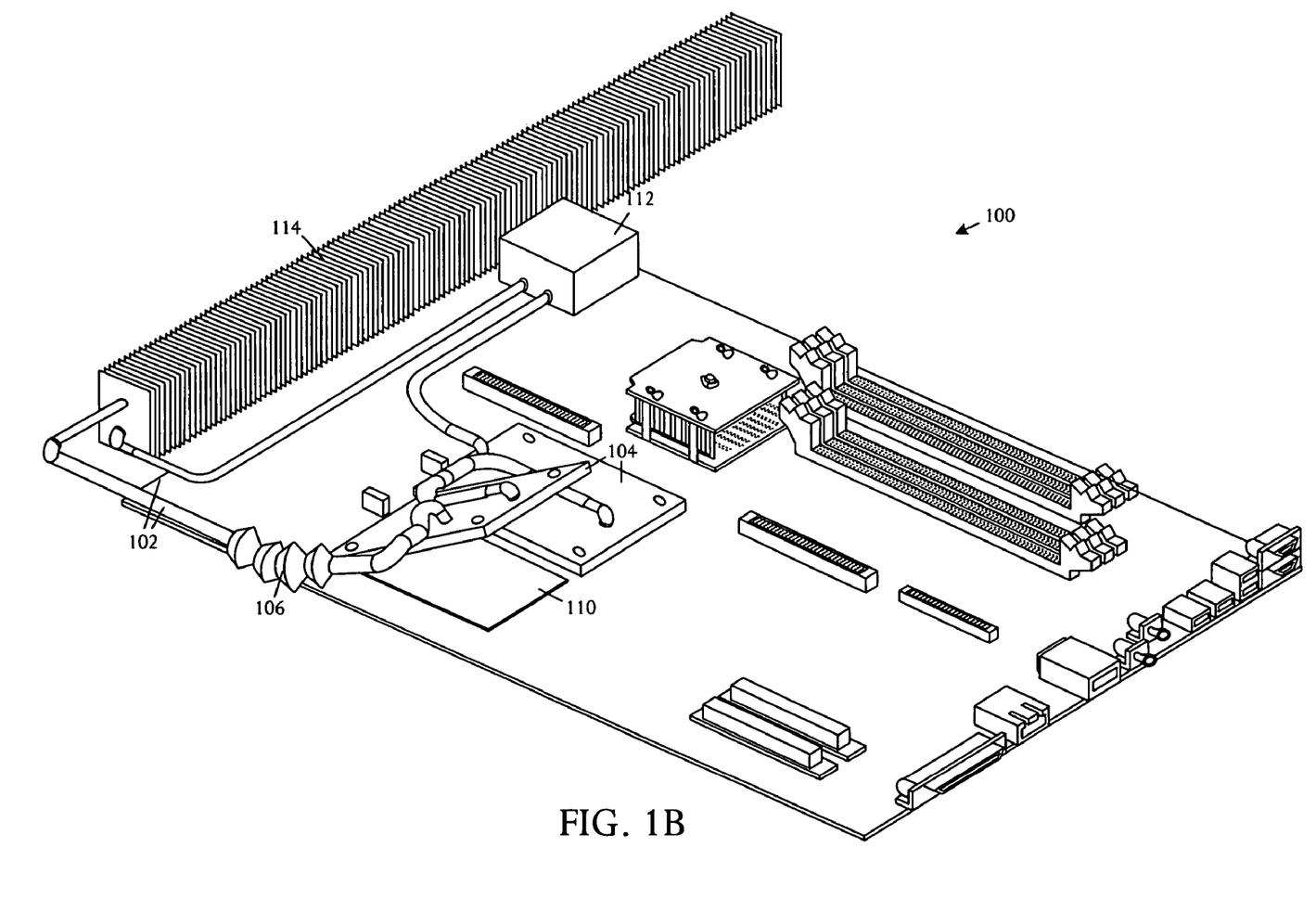
Figure 1C:
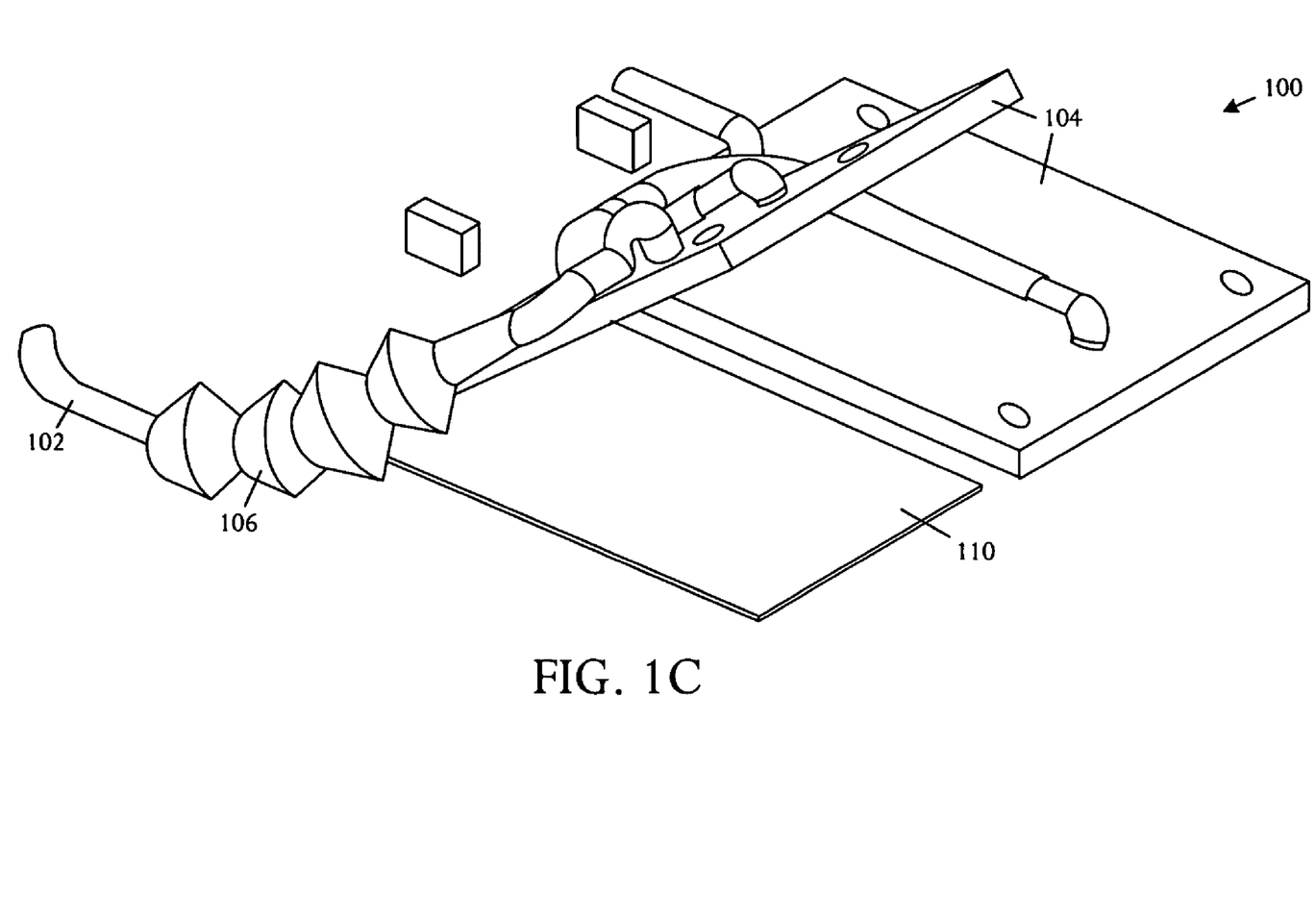

Referring to FIGS. 1A, 1B, and 1C, perspective pictorial diagrams illustrate an embodiment of a liquid loop cooling apparatus 100. The liquid loop cooling apparatus 100 includes a tubing 102 enclosing an interior bore or lumen within which a cooling fluid can circulate, a moveable cold plate 104 rigidly coupled to the tubing 102, and at least one flexible bellows 106 coupled to the tubing 102 and flexibly enabling movement of the moveable cold plate 104.

FIG. 1A shows the liquid loop cooling apparatus 100 with the cold plates 104 in a closed position. FIG. 1B shows the liquid loop cooling apparatus 100 with one of the cold plates 104 in an open position. The liquid loop cooling apparatus 100 further includes a moveable cold plate 104 to supply cooling to a heat-dissipating electrical component or device 110, for example a high-performance processor. The liquid loop cooling apparatus 100 is typically used in an electronic system that includes a plurality of electronic devices or components 110, such as components that generate heat as a byproduct of the component's functionality. The cold plate 104 is typically placed in contact with a heat-dissipating component 110 or attached to a heat-dissipating component 110 to facilitate cooling of the component 110. The cold plate 104 is moveable to enable addition, replacement, or removal of the associated heat-dissipating component 110. FIG. 1C depicts an enlarged view of the liquid loop cooling apparatus 100 with a cold plate 104 opened to further illustrate the associated heat-dissipating device or component 110.

The flexible bellows 106 facilitate a capability for the cold plate 104 to be rotated up and away from the heat-dissipating device or component 110 to enable access to the heat-dissipating device or component 110.

The liquid loop cooling apparatus 100 circulates coolant through a closed loop that contains components and devices for flow control, heat absorption, and heat removal. Tubing 102, for example constructed from various plastics or metals, makes up the cooling loop generally arranged in multiple branches using various disconnect elements, and three-way tee or four-way cross junctions.

The bellows can be constructed from various plastic, rubber, various metals, and the like, depending on construction characteristics of the liquid loop.

Associated with some or all components 110, particularly heat-dissipating components, may be one or more cold plates 104 or heat sinks that promote localized cooling of heat sources by transferring heat to coolant within the tubing 102. A cold plate 104 is typically implemented to cover a heat-dissipating component. A cold plate 104 includes a metal plate with embedded passages for carrying the circulating coolant fluid. Flow distribution within the passages can create a uniform cooling over the cold plate surface.

Examples of cooling structures within a cold plate include cooling elements with a serpentine pattern of cooling liquid-carrying tubules or a manifold with narrow liquid-carrying passages. Liquid circulating through the cooling structure creates a cooling effect that dissipates heat generated by the component 110. The cooling structure may efficiently transfer thermal energy by forced single-phase liquid convective cooling, by changes in phase such as evaporative cooling, or the like.

One example of a suitable cold plate 104 is a tubed-flow cold plate that generally uses a copper or stainless steel tube pressed into a channeled aluminum extrusion. An increasing number of loops in the cold plate passage improve cold plate performance. Another cold plate example is a distributed-flow cold plate wherein liquid flow is distributed within the cold plate 104. A distributed-flow cold plate may include cross-flow tubes embedded in a solid block of a cold plate. Cross-flow tubes are joined to main tubes to form a U- or Z-flow path configuration. Alternatively, cross-flow passages can be created by joining an extruded aluminum block with microchannels coupled to collector tubes. Some cold plates may include fins brazed into a cavity within the cold plate. Performance of the distributed-flow cold plate varies with uniformity of flow distribution within the plate.

Referring to FIGS. 1A and 1B, in some embodiments the liquid loop cooling apparatus 100 may further include a pump 112 coupled to the tubing 102, and a liquid-to-air heat exchanger 114 coupled to the tubing 116. The pump 112 is capable of dissipating a pressure head suitable to drive a cooling fluid interior to the tubing 102 through the loop. Some embodiments may omit the pump 112. For example the fluid motion may be gravity-aided or a wick structure in the tubing to drive the fluid. The one or more cold plates 104 coupled to the tubing 102 are typically positioned in close or intimate contact with heat-dissipating components 104 to supply local cooling.

Another optional element of the liquid loop cooling apparatus 100 is the liquid-to-air heat exchanger 114 that can be coupled to the tubing 102 to enable removal of heat absorbed by the coolant as the fluid circulates within the coolant loop.

Figure 1D:
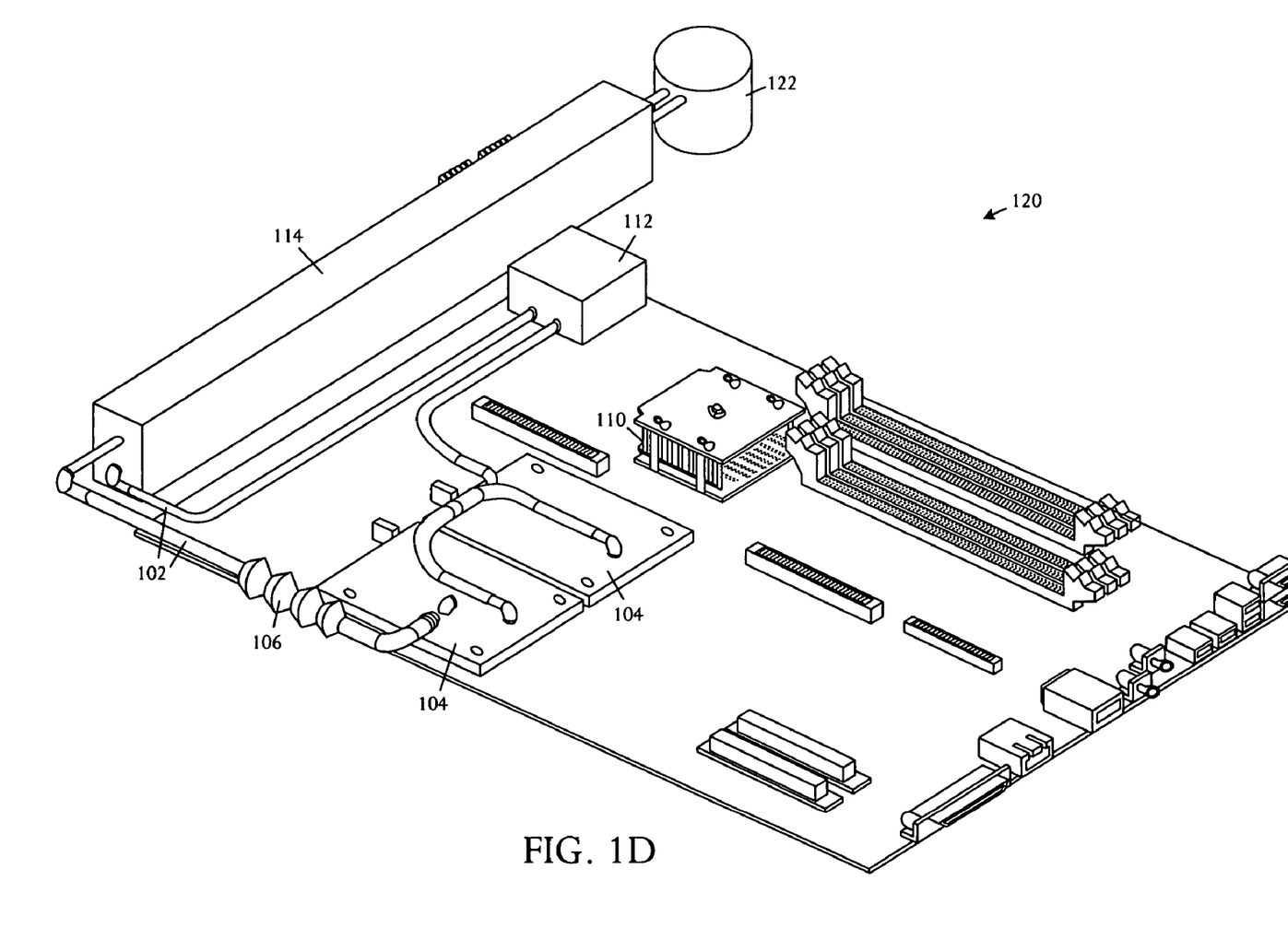

Referring to FIG. 1D, a perspective pictorial view shows an alternative embodiment of a liquid loop cooling apparatus 120 that further includes a reservoir 122 coupled to the tubing 102. The reservoir 122 can accumulate cooling fluid.

The liquid loop cooling apparatus 100 uses the one or more pumps 112 in combination with the reservoir 122 to circulate flow through the loop. The liquid reservoir 122 maintains system pressure and compensates for any possible leakage. The coolant loop may further include a filter to remove particulates from the circulating coolant. A reservoir 122 can be used on the low pressure/suction side of a pump 112 to maintain a source of fluid to the system.

Referring to FIGS. 2A-2E, several perspective pictorial views show embodiments of bellows that are suitable for usage in a liquid loop cooling apparatus.

Figure 2A:
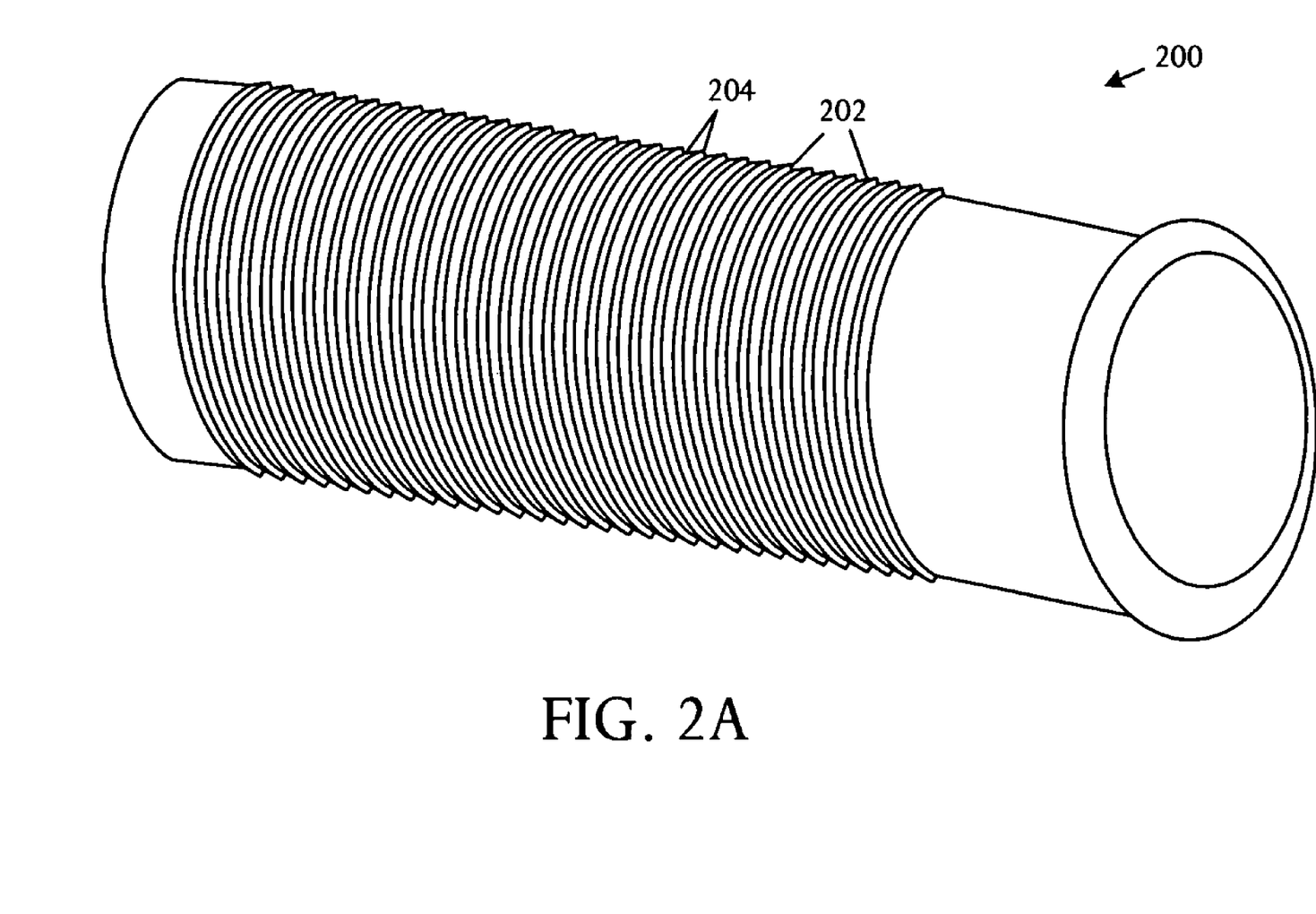
FIGS. 2A-2E are perspective pictorial views showing various embodiments of bellows that are suitable for usage in a liquid loop cooling apparatus.

FIG. 2A shows a flexible bellows connector 200 for usage between two rigid members. The bellows 200 can be used as dampening devices, expansion joints, shielding devices, and the like. The illustrative bellows 200 is capable of various deflections including lateral, axial, and/or angular deflection. The bellows 200 includes multiple web portions 202, the relatively flat part of each folded section, and the hinge 204, the space between the webs 202 that enables the bellows 200 to fold flat and stretch. The bellows 200 has relatively large number of relatively short web portions 202 so that the bellows 200 maintains a generally regular shape during flexure at the expense of some limitation of motion.

The bellows 200 may be constructed from various materials including plastics, such as neoprene, or other elastomers. Other suitable materials include neoprene or polyvinyl chloride (PVC) coated fabrics, glass cloths coated with aluminum or silicone rubber.

Figure 2B:
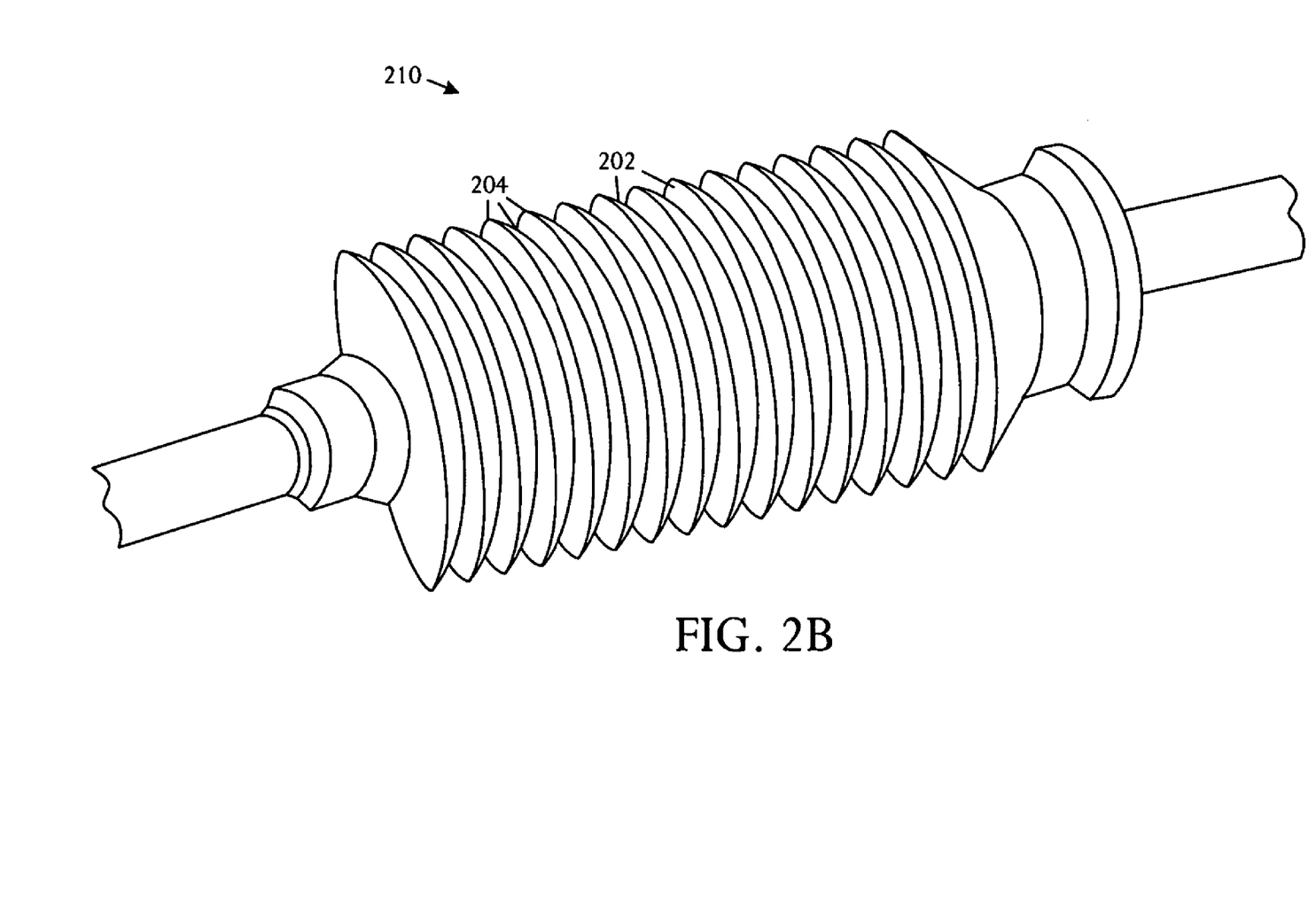

FIG. 2B shows an alternative example of a suitable bellows 210. Any suitable type of bellows can be used in the liquid loop cooling system. The web 202 for the bellows 210 has a flat shape profile, enabling long-stroke capability, stroke linearity with pressure and suitable resistance to pressure. The web portion 202 of the bellows 210 is relatively longer than the web for the bellows 200 shown in FIG. 2A, for many materials enabling a wider range of motion.

Figure 2C:
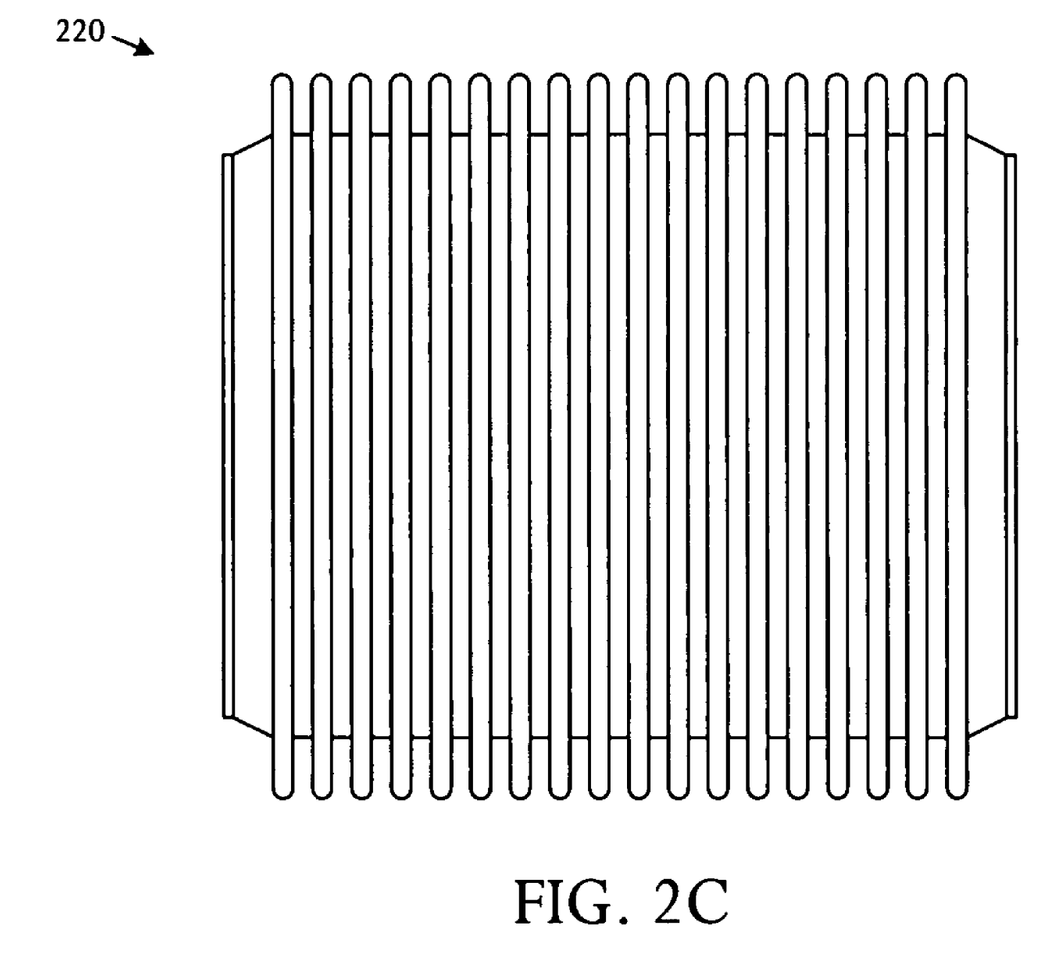

FIG. 2C illustrates an example of a bellows 220 with a flat cantilever shape profile that gives a constant effective area, resulting in a force output that is linear with pressure.

Various types of bellows can be used including single-ply and multiple-ply bellows. In some cases, multiple-ply bellows are desired since the spring rate of the bellows is proportional to the cube of the wall thickness. Accordingly, multiple-ply construction is useful for high-pressure conditions due to a greater flexibility than a single-ply form with an equivalent total wall thickness.

The spring rate of a bellows varies according to diameter, wall thickness, the number of convolutions, and the material of construction. Flexibility is the deflection of each convolution per change in pressure. Elastic imperfections can be reduced or minimized by using the bellows in combination with a spring with a spring rate higher than that of the bellows.

In some applications, highly-flexible bellows are desired and obtained by configuring the bellows with deeper convolutions, resulting in increased deflection during flexure while spring rate and maximum working pressure are relatively reduced.

Some bellows are heat treated at low temperatures for stress relief annealing, increasing spring rate while stabilizing the material and reducing creep, drift, and hysteresis.

The bellows is generally used in compression at maximum pressures suitably limited to prevent permanent distortion and/or alteration of structural characteristics. Mechanical stops or spring retainers can be used to avoid the possibility of overcompression. Bellows that are substantially longer than the axial outside diameter may risk axial distortion even in pressures lower than the maximum ratings.

Figure 2D:
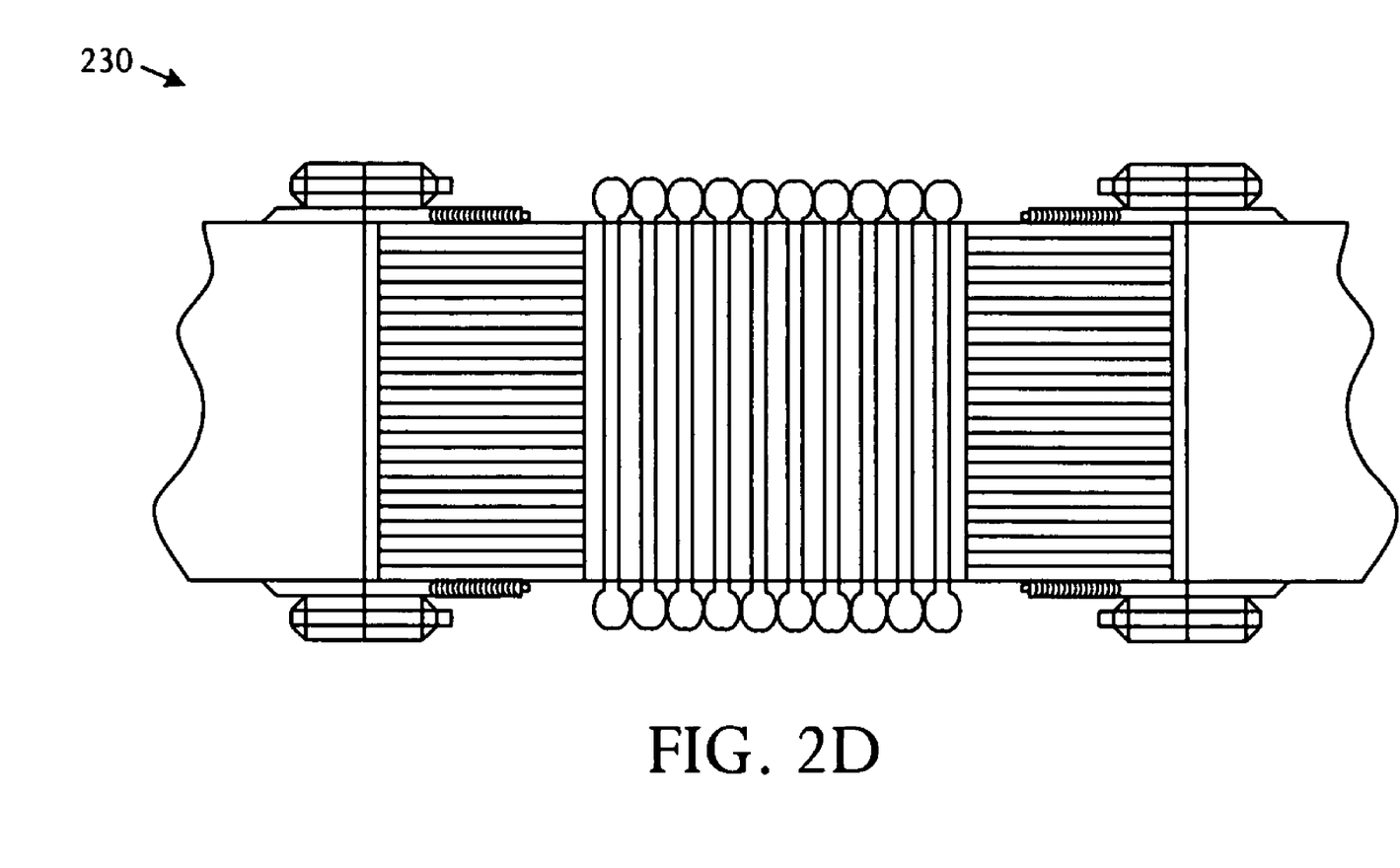
Figure 2E:
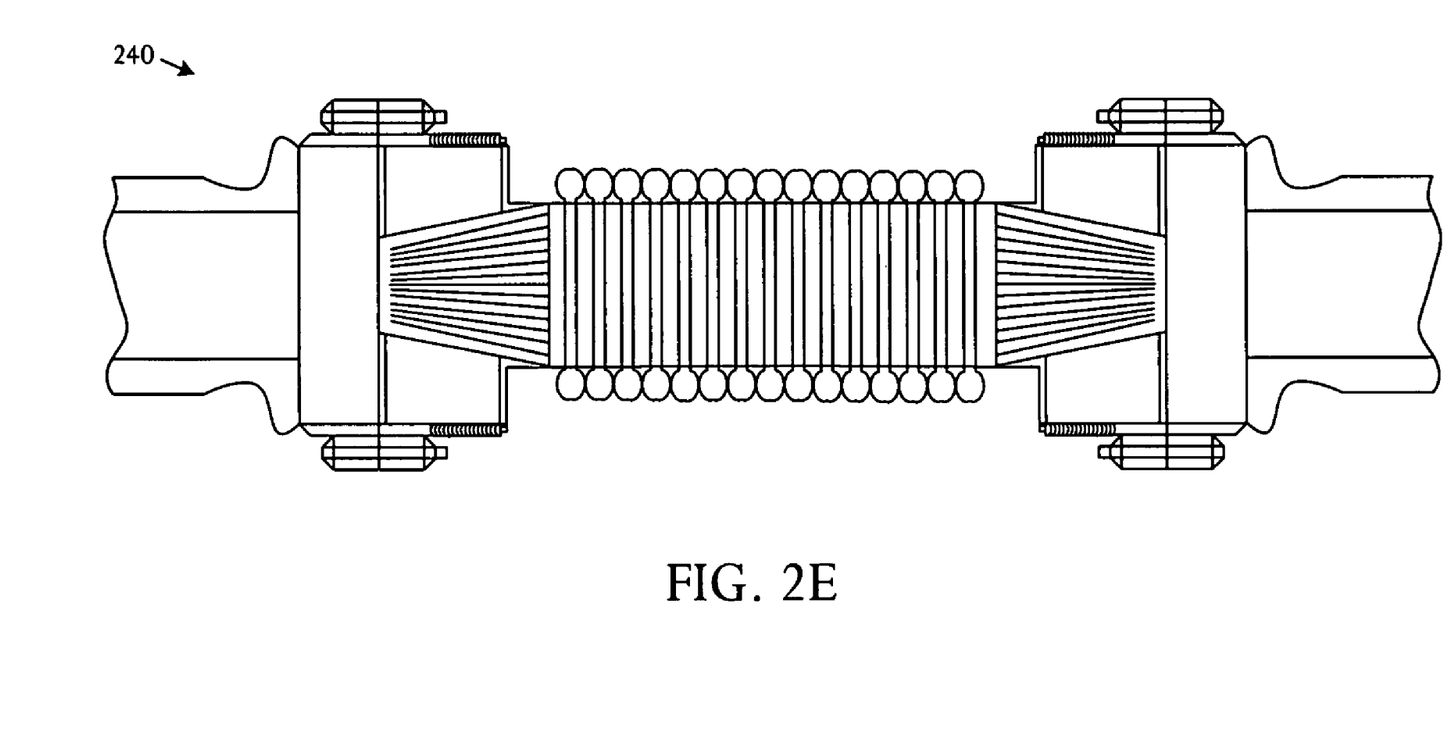

FIGS. 2D and 2E depict alternative examples of bellows 230 and 240, respectively, in the form of toroidal bellows. Toroidal bellows are highly useful for high pressures while maintaining a constant effective area and high spring rate.

Various types of bellows may be constructed by edge-welding, forming, and deposition. An edge-welded metal bellows includes convolutions formed by welding individually stamped annular diagrams at inner and outer edges.

Figure 3A:
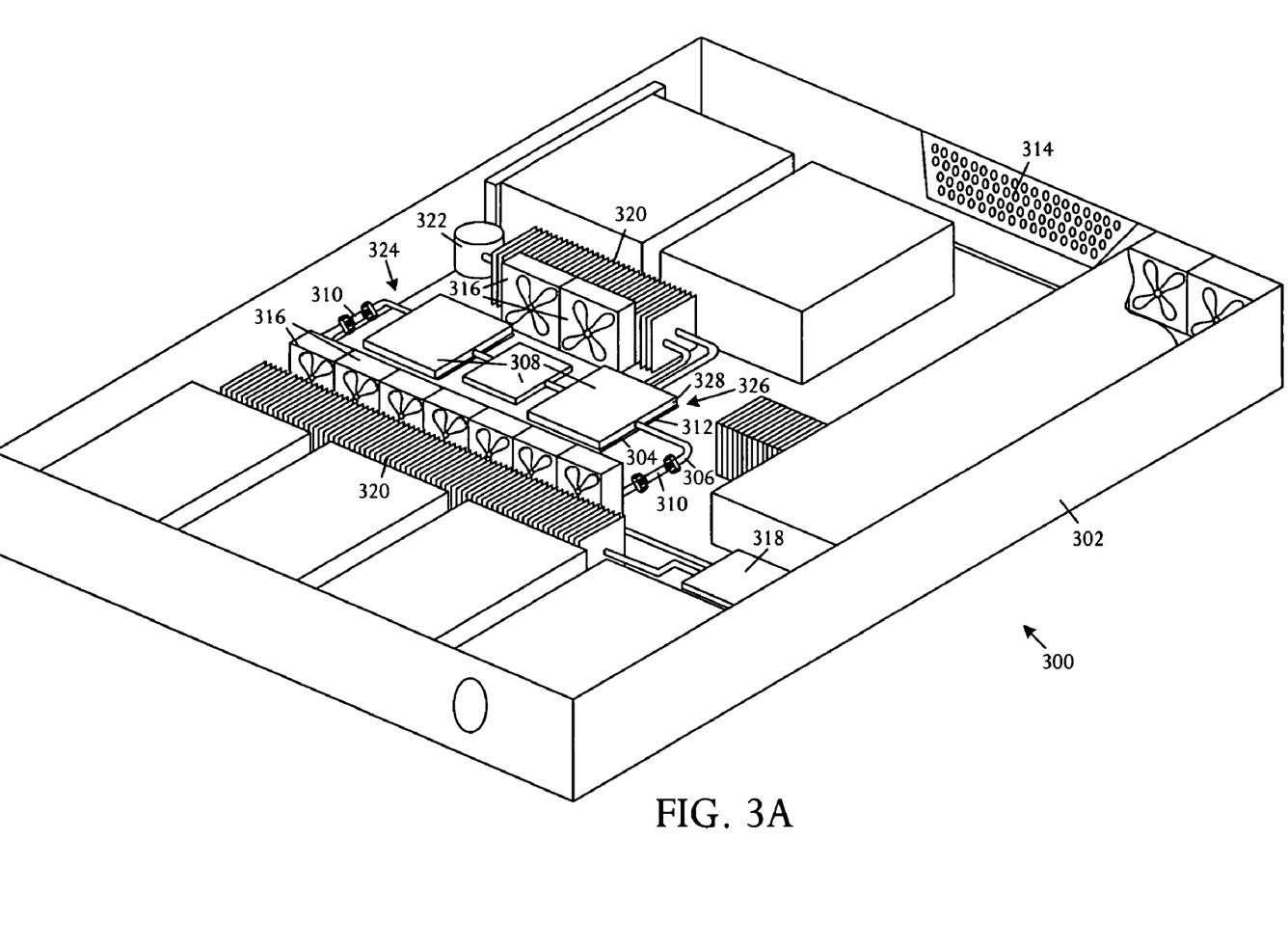
FIGS. 3A and 3B show a perspective pictorial diagram and an overhead pictorial view illustrating embodiments of an electronic system with a liquid loop cooling system using flexible bellows to facilitate serviceability.
Figure 3B:
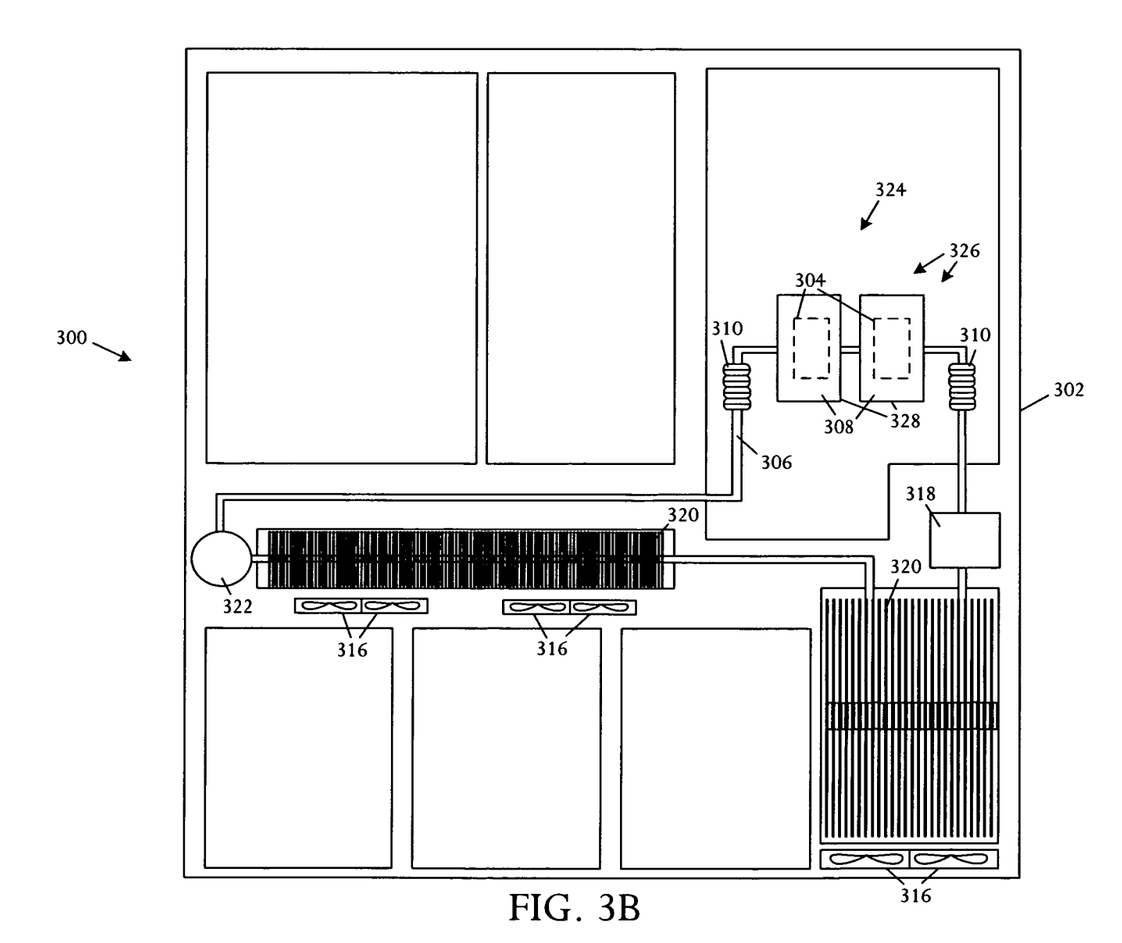

Referring to FIGS. 3A and 3B, a perspective pictorial diagram and an overhead pictorial view illustrate embodiments of an electronic system 300, such as a computer server, that comprises a chassis 302, a plurality of components 304 mounted within the chassis 302 including at least one heat-dissipating component. A tubing 306 enclosing an interior bore contains a cooling fluid that circulates among the components 304 in a closed-loop system. A moveable cold plate 308 is rigidly coupled to the tubing 306. One or more flexible bellows 310 are coupled to the tubing, flexibly enabling movement of the moveable cold plate 308.

The bellows 310 can be implemented in one tube of the liquid loop. Bellows 310 can be used on one or more of the other tubing legs, depending on the circumstances of mechanical isolation.

A heat-dissipating component 304 is associated with the moveable cold plate 308. The cold plate 308 is moveable to enable addition, replacement, or removal of the component 304. The cold plate 308 can be rotated up and away from the heat-dissipating component 304 to enable access. Commonly, the cold plate 308 is associated with a heat-dissipating component 304 and, for example, can be located overlying or attached to the heat-dissipating component 304. Accordingly, the moveable cold plate 308 often encloses the heat-dissipating component 304.

In some embodiments, the electronic system 300 can further include airflow inlet and outlet vents 314 in the chassis 302, and one or more fans 316 that can circulate air from the inlet vents to the outlet vents 314.

In some embodiments, the electronic system 300 is efficiently sized into a relatively small package, for example with the chassis 302 configured as a compact form factor chassis. Common compact sizes are of the order of 1U or 2U form factors.

In some embodiments, a pump 318 can be coupled to the tubing 306 to assist in circulating cooling fluid through the liquid loop. In other embodiments, a pump may be omitted, for example using gravity-assistance or a wick structure in the tubing to facilitate fluid flow. For example, pumping action can be gained using a two-phase heat-transport device that exploits surface tension forces induced in a fine pore wick under heat application to drive a working fluid.

Another optional component of the liquid loop cooling system is a liquid-to-air heat exchanger 320 that can be coupled to the tubing 306. A further optional component is a reservoir 322 that can be coupled to the tubing for accumulating cooling fluid.

Liquid loop cooling may be used in various applications for the thermal management of electronics resulting from increasing power densities in power electronics, defense, medical, and computer applications. Liquid loop cooling is increasingly useful for high-end servers, storage systems, telecommunication equipment, automatic test equipment, and the like as a result of enhancements in power densities and reduction packaging size.

Liquid loop cooling systems use closed-loop circulation of a coolant and may include flow distribution components such as tubes and pumps, flow control devices including valves and orifices, and heat transfer devices such as cold plates and heat exchangers. The designs of liquid loop cooling systems are generally arranged to create and distribute a sufficient total flow to maintain electronic component temperature at a suitable level.

The liquid loop cooling system is generally designed by sizing individual components so that a desired coolant flow is delivered to the cold plates 308 and/or heat sinks to which electronic devices and components are mounted. The cold plates 308 and/or heat sinks are selected to attain effective and uniform cooling.

A designer may arrange the liquid loop cooling system in the electronic system 300 by distributing one or more electronic system components 304, including at least one heat-dissipating component, in the chassis 302. The rigid or semi-rigid tubing 306, which encloses an interior bore, circulates the cooling fluid among the one or more heat-dissipating components in the closed-loop system. At least one flexible bellows 310 is attached to the tubing 306 adjacent or nearby the removable cold plates 308 enabling access to components 304 enclosed within the cold plates 308.

Again referring to FIGS. 3A and 3B, in accordance with another embodiment of a liquid loop cooling apparatus 324, a cold plate component 326 includes a cover plate 328 convertibly enclosing the heat-dissipating component 304. The liquid loop cooling apparatus 324 further includes a tubing 306 coupled to the cold plate component 326 and enclosing an interior bore or lumen within which a cooling fluid can circulate. A flexible bellows 310 is coupled to the tubing 306 and flexibly enables convertible movement of the cover plate 328.

In some embodiments, the liquid loop cooling apparatus 324 includes a pump 318 coupled to the tubing 306 and a liquid-to-air heat exchanger 320 also coupled to the tubing 306. Also in various embodiments, the liquid loop cooling apparatus 324 may also have a reservoir 322 coupled to the tubing 306 and capable of accumulating cooling fluid.

A liquid loop cooling system can be configured for usage in an electronic system 300 by convertibly containing the heat-dissipating component 304 within the cold plate 308, rigidly coupling the cold plate 308 to the liquid loop tubing 306, and coupling at least one flexible bellows 310 to the liquid loop tubing 306 to enable convertible movement of the cold plate 308 away from the heat-dissipating component 304.

A plurality of electronic system components 304 including at least one heat-dissipating component are arranged or distributed in the chassis 302 and rigid or semi-rigid tubing 306 is routed through the components 304. The tubing 306 encloses an interior bore or lumen within which a cooling fluid can circulate among the one or more heat-dissipating components 304 in a closed-loop system.

The one or more cold plates 308 are rigidly connected to the tubing 306 at locations that facilitate heat dissipation from the heat-dissipating components.

In some embodiments, the pump 318 and one or more liquid-to-air heat exchangers 320 can be rigidly connected to the tubing 306. In addition to facilitating opening of the cover plates 308, the flexible bellows 310 also disperse physical strains and shocks along the rigid or semi-rigid tubing 306, reducing the possibility of damage to the liquid loop cooling system.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure and modifications can be made which are within the scope of the claims. Variations and modifications of the embodiments disclosed herein may also be made while remaining within the scope of the following claims. For example, although particular shapes, sizes, and geometries of the bellows are shown, other arrangements are possible. Also, particular electronic system embodiments are illustrated, for example a computer server. In other embodiments, the bellows can be employed in other types of electronic systems such as communication systems, storage systems, entertainment systems, and the like.

What is claimed is:

1. A liquid loop cooling apparatus comprising:
   a tubing enclosing an interior lumen within which a cooling fluid can circulate;
   a moveable cold plate that rotates between an open position and a closed position rigidly coupled to the tubing; and at least one flexible bellows coupled to the tubing that flexibly enables movement of the moveable cold plate between the open and closed positions.

2. The cooling apparatus according to claim 1 further comprising:
a heat-dissipating component associated with the moveable cold plate, the cold plate being moveable between the open and closed positions to enable addition, replacement, or removal of the heat-dissipating component.

3. The cooling apparatus according to claim 2 wherein:
the cold plate configured for rotation up and away from the heat-dissipating component to enable access to the heat-dissipating component.

4. The cooling apparatus according to claim 1 further comprising:
a pump coupled to the tubing; and
a liquid-to-air heat exchanger coupled to the tubing.

5. The cooling apparatus according to claim 1 further comprising:
a reservoir coupled to the tubing and capable of accumulating cooling fluid.

6. A computer server comprising:
a chassis;
a plurality of components mounted within the chassis including at least one heat-dissipating component;
a tubing enclosing an interior lumen within which a cooling fluid can circulate;
a moveable cold plate that rotates between an open position and a closed position rigidly coupled to the tubing; and
at least one flexible bellows coupled to the tubing that flexibly enables movement of the moveable cold plate between the open and closed positions.

7. The server according to claim 6 further comprising:
airflow inlet and outlet vents in the chassis; and
at least one fan capable of circulating air from the inlet vents to the outlet vents.

8. The server according to claim 6 further comprising:
a heat-dissipating component associated with the moveable cold plate, the cold plate being moveable between the open and closed positions to enable addition, replacement, or removal of the heat-dissipating component.

9. The server according to claim 6 wherein:
the cold plate configured for rotation up and away from the heat-dissipating component to enable access to the heat-dissipating component.

10. The server according to claim 6 further comprising:
a pump coupled to the tubing; and
a liquid-to-air heat exchanger coupled to the tubing.

11. The server according to claim 6 further comprising:
a reservoir coupled to the tubing and capable of accumulating cooling fluid.

12. A method of arranging a liquid loop cooling system in an electronic system comprising:
providing a cold plate that rotates between an open position and a closed position;
convertibly containing a heat-dissipating component within the cold plate; and
rigidly coupling the cold plate to a liquid loop tubing; and
coupling at least one flexible bellows to the liquid loop tubing to enable convertible rotation of the cold plate between the open and closed positions whereby the heat-dissipating component is selectively accessed or covered.

13. The method according to claim 12 further comprising:
distributing a plurality of electronic system components including at least one heat-dissipating component in a chassis; and
arranging a rigid or semi-rigid tubing enclosing an interior lumen within which a cooling fluid can circulate among the at least one heat-dissipating component in a closed-loop system.

14. The method according to claim 12 further comprising:
rigidly connecting at least one cold plate to the tubing in a location that dissipates heat from a heat-dissipating component.

15. The method according to claim 12 further comprising:
rigidly connecting a pump to the tubing; and
rigidly connecting a liquid-to-air heat exchanger to the tubing.

16. The method according to claim 12 further comprising:
rigidly connecting a reservoir to the tubing.

17. A liquid loop cooling apparatus comprising:
a cold plate component further comprising:
a heat-dissipating component; and
a cover plate that rotates between an open position and a closed position convertibly enclosing the heat-dissipating component;
a tubing coupled to the cold plate component and enclosing an interior lumen within which a cooling fluid can circulate; and
a flexible bellows coupled to the tubing that flexibly enables convertible movement of the cover plate between the open and closed positions.

18. The cooling apparatus according to claim 17 further comprising:
a pump coupled to the tubing; and
a liquid-to-air heat exchanger coupled to the tubing.

19. The cooling apparatus according to claim 17 further comprising:
a reservoir coupled to the tubing and capable of accumulating cooling fluid.

20. A liquid loop cooling apparatus comprising:
means for carrying a circulating cooling fluid among at least one heat-dissipating component in a closed-loop system;
means coupled to the carrying means for dissipating heat;
means for containing the heat dissipating means;
means for convertibly rotating the containing means between an open position and a closed position whereby the heat dissipating means is selectively accessed and covered; and
means coupled to the carrying means for flexibly enabling movement of the convertibly containing means between the open and closed positions whereby the heat dissipating means is selectively accessed or covered.

* * * * *